(12) United States Patent
Xu et al.

(10) Patent No.: US 10,505,298 B2
(45) Date of Patent: Dec. 10, 2019

(54) JOINT STRUCTURE OF A RESIN MULTILAYER SUBSTRATE AND A CIRCUIT BOARD

(71) Applicant: Murata Manufacturing Co., Ltd., Nagaokakyo-shi, Kyoto-fu (JP)

(72) Inventors: Chu Xu, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/504,370

(22) Filed: Jul. 8, 2019

(65) Prior Publication Data

US 2019/0334262 A1 Oct. 31, 2019

Related U.S. Application Data

(63) Continuation of application No. 16/002,004, filed on Jun. 7, 2018, which is a continuation of application No. PCT/JP2016/086334, filed on Dec. 7, 2016.

(30) Foreign Application Priority Data

Jan. 20, 2016 (JP) .................................. 2016-008379

(51) Int. Cl.
*H01R 12/52* (2011.01)
*H05K 1/02* (2006.01)
(Continued)

(52) U.S. Cl.
CPC ............ *H01R 12/52* (2013.01); *H01R 12/62* (2013.01); *H05K 1/0271* (2013.01); *H05K 1/0298* (2013.01); *H05K 1/0313* (2013.01); *H05K 1/113* (2013.01); *H05K 3/363* (2013.01); *H05K 3/368* (2013.01); *H05K 1/144* (2013.01); *H05K 2201/0129* (2013.01); *H05K 2201/041* (2013.01); *H05K 2201/052* (2013.01); *H05K 2201/056* (2013.01); *H05K 2201/09027* (2013.01); *H05K 2201/09045* (2013.01); *H05K 2201/09263* (2013.01);
(Continued)

(58) Field of Classification Search
None
See application file for complete search history.

(56) References Cited

FOREIGN PATENT DOCUMENTS

JP 02-092967 U 7/1990

OTHER PUBLICATIONS

Official Communication issued in corresponding Japanese Patent Application No. 2018-122660, dated Jul. 16, 2019.
(Continued)

*Primary Examiner* — Dimary S Lopez Cruz
(74) *Attorney, Agent, or Firm* — Keating & Bennett, LLP

(57) ABSTRACT

A resin multilayer substrate includes a substrate main body including first, second, and third wiring portions connected to one another by a connecting portion. First, second and third external connection terminals are respectively included in the first, second and third wiring portions. The first external connection terminal includes a conductor exposed at a surface of the substrate main body. The second and third external connection terminals include connectors mounted on conductors on the surface of the substrate main body. An auxiliary mounting conductor is disposed between the first external connection terminal and the second and third external connection terminals on the surface of the substrate main body.

16 Claims, 11 Drawing Sheets

(51) Int. Cl.
 *H05K 1/03* (2006.01)
 *H05K 1/14* (2006.01)
 *H05K 3/36* (2006.01)
 *H01R 12/62* (2011.01)
 *H05K 1/11* (2006.01)

(52) U.S. Cl.
 CPC .............. *H05K 2201/09945* (2013.01); *H05K 2201/1031* (2013.01); *H05K 2201/10189* (2013.01); *H05K 2201/10522* (2013.01)

(56) References Cited

OTHER PUBLICATIONS

Xu et al., "Resin Multilayer Substrate and Electronic Device", U.S. Appl. No. 16/002,004, filed Jun. 7, 2018.

JOINT STRUCTURE OF A RESIN MULTILAYER SUBSTRATE AND A CIRCUIT BOARD

CROSS REFERENCE TO RELATED APPLICATIONS

This application claims the benefit of priority to Japanese Patent Application No. 2016-008379 filed on Jan. 20, 2016 and is a Continuation Application of PCT Application No. PCT/JP2016/086334 filed on Dec. 7, 2016. The entire contents of each application are hereby incorporated herein by reference.

BACKGROUND OF THE INVENTION

1. Field of the Invention

The present invention relates to a resin multilayer substrate in which a plurality of signal conductors are provided and an electronic device in which the resin multilayer substrate is mounted on a circuit board.

2. Description of the Related Art

International Publication No. 2013/103130 discloses a resin multilayer substrate that includes a plurality of signal conductors. First signal conductors and second signal conductors are provided in the resin multilayer substrate described in International Publication No. 2013/103130.

Ends of the first signal conductors and ends of the second signal conductors are connected to connectors that are mounted on a surface of the resin multilayer substrate. These connectors are external connection terminals of the resin multilayer substrate. Thus, the resin multilayer substrate is electrically and physically connected to an external circuit board by joining these connectors to connectors of the circuit board.

However, in the configuration described in International Publication No. 2013/103130, it is not easy to connect the connectors of the resin multilayer substrate to the corresponding connectors of the circuit board without applying an undesirable force to all of the connectors at the same time.

For example, when there are a plurality of connectors, the connectors are generally connected one by one. In order to bring one of the connectors that has not yet been connected close to the position of a connector of a circuit board, a force may sometimes be applied to the resin multilayer substrate (the resin multilayer substrate may sometimes be pulled). In this case, there is a possibility that a force will be applied to a portion of another one of the connectors that has already been connected to another connector of the circuit board, and as a result, the connector will be detached from the connector of the circuit board.

As described above, if all of the external connection terminals are connectors, one of the connectors may sometimes become detached depending on the manner in which a force is applied when connecting the connectors.

SUMMARY OF THE INVENTION

Preferred embodiments of the present invention provide resin multilayer substrates each capable of being easily connected to an external circuit board and having a high connection reliability.

A resin multilayer substrate according to a preferred embodiment of the present invention includes a substrate main body, a first signal conductor, a second signal conductor, a first external connection terminal, a second external connection terminal, and a third external connection terminal. The substrate main body includes a first wiring portion, a second wiring portion, and a third wiring portion that are connected to one another by a connecting portion, and a plurality of resin layers laminated together. The first signal conductor is provided in the substrate main body so as to extend over the first wiring portion and the second wiring portion. The second signal conductor is provided in the substrate main body so as to extend over the first wiring portion and the third wiring portion. The first external connection terminal is provided in the first wiring portion and connected to at least one of the first signal conductor and the second signal conductor. The second external connection terminal is provided in the second wiring portion and connected to the first signal conductor. The third external connection terminal is provided in the third wiring portion and connected to the second signal conductor. At least one of the first external connection terminal, the second external connection terminal, and the third external connection terminal is defined by a connector that is mounted on a conductor on a surface of the substrate main body, and at least another one of the first external connection terminal, the second external connection terminal, and the third external connection terminal is defined by a conductor that is on the surface of the substrate main body. An auxiliary mounting conductor is disposed between the external connection terminal defined by the connector mounted on the surface and the external connection terminal defined by the conductor on the surface.

In this configuration, at least one of a plurality of external connection terminals is connected to an external circuit board by a connector, and at least another one of the plurality of external connection terminals directly connects a conductor to the external circuit board. In addition, together with a connection terminal defined by a conductor, an auxiliary mounting conductor is directly joined to the external circuit board. This facilitates an operation to mount the resin multilayer substrate onto an external circuit board, and the reliability of mounting (connection of terminals) is improved.

A resin multilayer substrate according to a preferred embodiment of the present invention includes a resin multilayer substrate including a substrate main body, a first signal conductor, a second signal conductor, a first external connection terminal, a second external connection terminal, and a third external connection terminal. The substrate main body includes a first wiring portion, a second wiring portion, and a third wiring portion that are connected to one another by a connecting portion and includes a plurality of resin layers laminated together. The first signal conductor is provided in the substrate main body so as to extend over the first wiring portion and the second wiring portion. The second signal conductor is provided in the substrate main body so as to extend over the first wiring portion and the third wiring portion. The first external connection terminal is provided in the first wiring portion and connected to at least one of the first signal conductor and the second signal conductor. The second external connection terminal is provided in the second wiring portion and connected to the first signal conductor. The third external connection terminal is provided in the third wiring portion and connected to the second signal conductor. In the first wiring portion, the first signal conductor and the second signal conductor are disposed in a row in a direction in which the plurality of resin layers are laminated together. The first external connection terminal is defined by a connector that is mounted on a conductor on a surface of the substrate main body. At least one of the second external connection terminal and the third external connection terminal is defined by a conductor on the surface of the substrate main body.

This configuration facilitates a mounting operation, and the distance between one of the first signal conductor and the second signal conductor that is closer to a mounting surface than the other is and the mounting surface is able to be increased while obtaining connection reliability.

A resin multilayer substrate according to a preferred embodiment of the present invention includes a resin multilayer substrate including a substrate main body, a first signal conductor, a second signal conductor, a first external connection terminal, a second external connection terminal, and a third external connection terminal. The substrate main body includes a first wiring portion, a second wiring portion, and a third wiring portion that are connected to one another by a connecting portion, and a plurality of resin layers laminated together. The first signal conductor is provided in the substrate main body so as to extend over the first wiring portion and the second wiring portion. The second signal conductor is provided in the substrate main body so as to extend over the first wiring portion and the third wiring portion. The first external connection terminal is provided in the first wiring portion and connected to at least one of the first signal conductor and the second signal conductor. The second external connection terminal is provided in the second wiring portion and connected to the first signal conductor. The third external connection terminal is provided in the third wiring portion and connected to the second signal conductor. In the first wiring portion, the first signal conductor and the second signal conductor are disposed in a row in a direction in which the plurality of resin layers are laminated together. The first wiring portion includes a buffering portion that is positioned between a position of the first external connection terminal and an end portion of the first wiring portion that is continuous with the connecting portion and that has low elasticity in a direction connecting the position of the first external connection terminal and the end portion of the first wiring portion that is continuous with the connecting portion.

With this configuration, the degree of freedom regarding the shape of the first wiring portion is increased by the buffering portion. This facilitates the mounting operation.

In a resin multilayer substrate according to a preferred embodiment of the present invention, it is preferable that the auxiliary mounting conductor is a ground conductor.

With this configuration, the ground conductor is able to be easily and directly connected to an external ground conductor. As a result, a ground is able to further easily be stabilized.

In a resin multilayer substrate according to a preferred embodiment of the present invention, in the first wiring portion, the first signal conductor and the second signal conductor are disposed in a row in a direction in which the plurality of resin layers are laminated together.

With this configuration, the width of the first wiring portion is reduced so as to be equal or substantially equal to the width of the second wiring portion and the width of the third wiring portion.

In a resin multilayer substrate according to a preferred embodiment of the present invention, it is preferable that the first external connection terminal includes a connector that is mounted on a conductor on the surface of the substrate main body and that at least one of the second external connection terminal and the third external connection terminal is defined by a conductor on the surface of the substrate main body.

With this configuration, the distance between one of the first signal conductor and the second signal conductor that is closer to the mounting surface than the other is and the mounting surface is able to be increased.

In a resin multilayer substrate according to a preferred embodiment of the present invention, it is preferable that the first wiring portion include a buffering portion that is positioned between a position of the first external connection terminal and an end portion of the first wiring portion that is continuous with the connecting portion and that has low elasticity in a direction connecting the position of the first external connection terminal and the end portion of the first wiring portion that is continuous with the connecting portion.

With this configuration, the degree of freedom regarding the shape of the first wiring portion is increased by the buffering portion. This further facilitates the mounting operation and further improves the reliability.

In a resin multilayer substrate according to a preferred embodiment of the present invention, it is preferable that the resin layers are each made of a thermoplastic resin.

With this configuration, the substrate main body is able to be easily formed by hot pressing, and the joint reliability between the resin layers is improved. In addition, the resin multilayer substrate is able to be easily bent in the lamination direction of the resin layers.

In a resin multilayer substrate according to a preferred embodiment of the present invention, the substrate main body may include a bent portion at a position different from positions of the first external connection terminal, the second external connection terminal, and the third external connection terminal.

With this configuration, the variety of mounting structures and arrangements of the resin multilayer substrate onto a circuit board is increased.

An electronic device according to a preferred embodiment of the present invention includes one of the above-described resin multilayer substrates and a circuit board to which the first external connection terminal, the second external connection terminal, and the third external connection terminal are connected.

With this configuration, an electronic device in which a resin multilayer substrate is capable of being easily connected to an external circuit board and that has a high connection reliability is provided.

In an electronic device according to a preferred embodiment of the present invention, the circuit board may include a first circuit board to which the first external connection terminal is connected and a second circuit board to which the second external connection terminal or the third external connection terminal is connected.

With this configuration, the circuit board to which the first external connection terminal is connected and the circuit board to which the second external connection terminal or the third external connection terminal is connected are different from each other. In the case in which a resin multilayer substrate is connected to a plurality of circuit boards as described above, by providing a resin multilayer substrate having the above-described configuration, the resin multilayer substrate is able to be further easily connected to the circuit board.

An electronic device according to a preferred embodiment of the present invention includes the above-described resin multilayer substrate in which the first signal conductor and the second signal conductor are disposed in a lamination direction in the first wiring portion and a circuit board to which the first external connection terminal, the second external connection terminal, and the third external connection terminal are connected. The circuit board includes a circuit conductor that faces the first signal conductor and the second signal conductor.

With this configuration, the distance between one of the first signal conductor and the second signal conductor that is closer to a mounting surface than the other is and the mounting surface is able to be increased, and coupling of these signal conductors is able to be reduced or prevented.

According to preferred embodiments of the present invention, resin multilayer substrates capable of being easily connected to external circuit boards and having high connection reliability are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
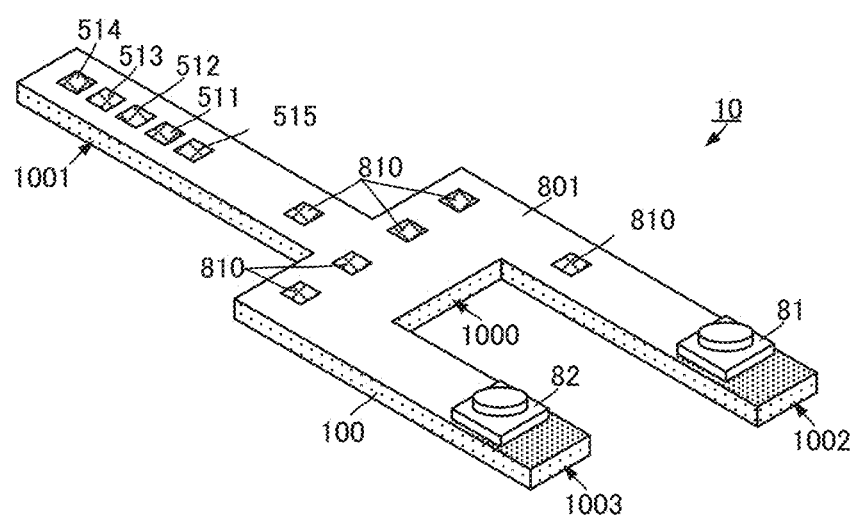
FIG. 1 is an external perspective view of a resin multilayer substrate according to a first preferred embodiment of the present invention.
Figure 2:
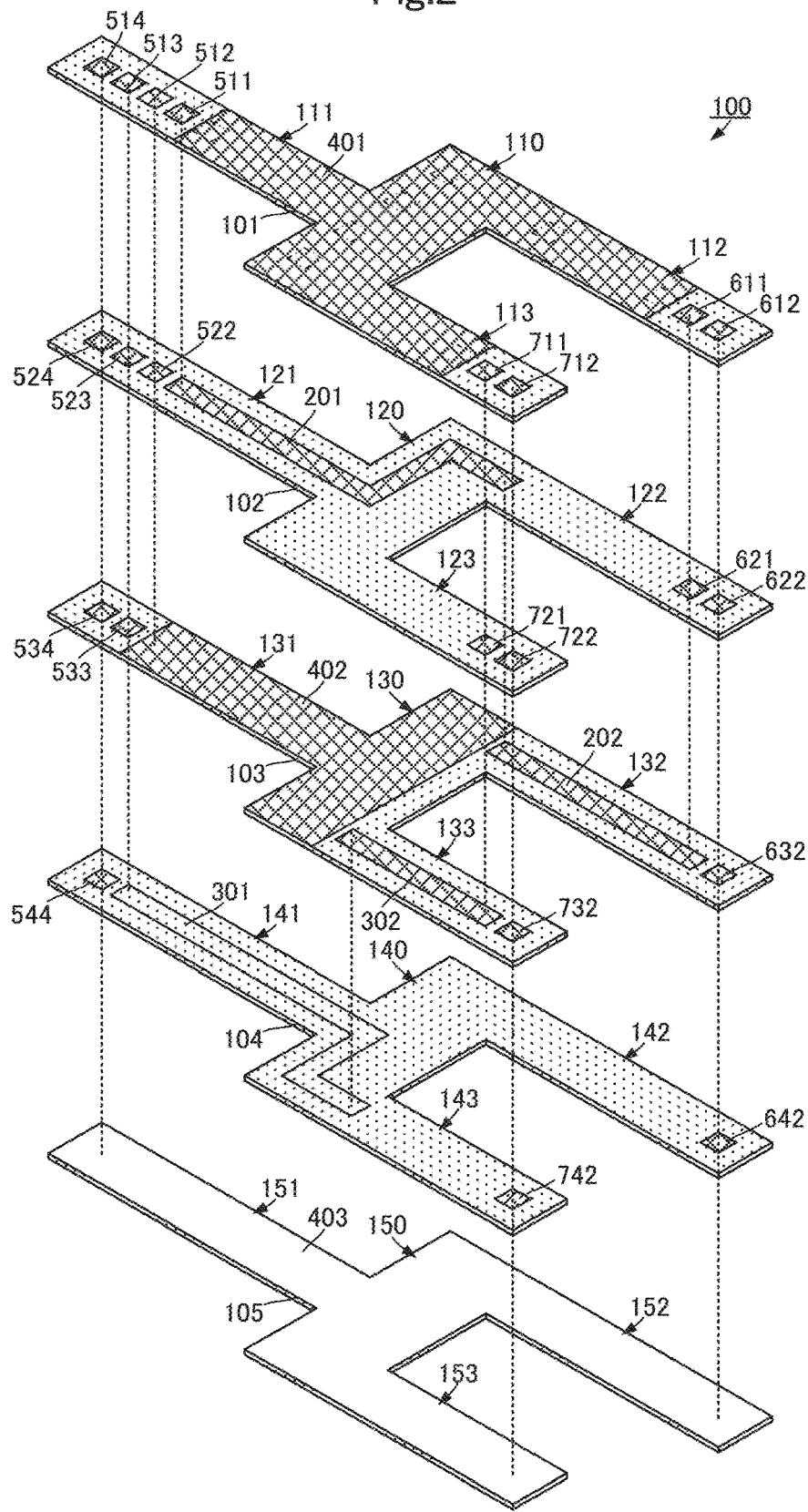
FIG. 2 is an exploded perspective view of the resin multilayer substrate according to the first preferred embodiment of the present invention.

Resin multilayer substrates and an electronic device according to a first preferred embodiment of the present invention will be described with reference to the drawings. FIG. 1 is an external perspective view of the resin multilayer substrate according to the first preferred embodiment of the present invention. FIG. 2 is an exploded perspective view of the resin multilayer substrate according to the first preferred embodiment of the present invention. Note that an insulating protective film and connectors are not illustrated in FIG. 2.

As illustrated in FIG. 1, a resin multilayer substrate 10 includes a substrate main body 100, an insulating protective film 801, and connectors 81 and 82. As illustrated in FIG. 2, the substrate main body 100 includes resin layers 101, 102, 103, 104, and 105. The resin layers 101, 102, 103, 104, and 105 are each preferably made of a thermoplastic resin which is, for example, a resin containing a liquid crystal polymer as a main component. The resin layers 101, 102, 103, 104, and 105 preferably have the same or substantially the same planar shape. The thickness of each of the resin layers 101, 102, 103, and 104 may be set in accordance with, for example, the impedance of a signal line, and in the case illustrated in FIG. 1, it is preferable that all of the resin layers have the same or approximately the same thickness.

The resin layers 101, 102, 103, 104, and 105 are stacked in this order (in the order of the resin layer 101, the resin layer 102, the resin layer 103, the resin layer 104, and the resin layer 105) from the side on which a mounting surface of the substrate main body 100 is provided. Hot pressing is performed on the resin layers 101, 102, 103, 104, and 105, which have been stacked on top of one another, so that the substrate main body 100 is formed. By using a thermoplastic resin for the resin layers 101, 102, 103, 104, and 105 as described above, the substrate main body 100 is able to be easily formed, and since a material different from the resin layers is not provided between the resin layers, the reliability is improved.

The resin layer 101 includes a first wiring portion 111, a second wiring portion 112, a third wiring portion 113, and a connecting portion 110. The first wiring portion 111, the second wiring portion 112, and the third wiring portion 113 are connected to one another by the connecting portion 110.

The resin layer 102 includes a first wiring portion 121, a second wiring portion 122, a third wiring portion 123, and a connecting portion 120. The first wiring portion 121, the second wiring portion 122, and the third wiring portion 123 are connected to one another by the connecting portion 120.

The resin layer 103 includes a first wiring portion 131, a second wiring portion 132, a third wiring portion 133, and a connecting portion 130. The first wiring portion 131, the second wiring portion 132, and the third wiring portion 133 are connected to one another by the connecting portion 130.

The resin layer 104 includes a first wiring portion 141, a second wiring portion 142, a third wiring portion 143, and a connecting portion 140. The first wiring portion 141, the second wiring portion 142, and the third wiring portion 143 are connected to one another by the connecting portion 140.

The resin layer 105 includes a first wiring portion 151, a second wiring portion 152, a third wiring portion 153, and a connecting portion 150. The first wiring portion 151, the second wiring portion 152, and the third wiring portion 153 are connected to one another by the connecting portion 150.

A portion that includes the first wiring portion 111 of the resin layer 101, the first wiring portion 121 of the resin layer 102, the first wiring portion 131 of the resin layer 103, the first wiring portion 141 of the resin layer 104, and the first wiring portion 151 of the resin layer 105 stacked on top of one another defines a first wiring portion 1001 (corresponding to "a first wiring portion") of the substrate main body 100 illustrated in FIG. 1.

A portion that includes the second wiring portion 112 of the resin layer 101, the second wiring portion 122 of the resin layer 102, the second wiring portion 132 of the resin layer 103, the second wiring portion 142 of the resin layer 104, and the second wiring portion 152 of the resin layer 105 stacked on top of one another defines a second wiring portion 1002 (corresponding to "a second wiring portion") of the substrate main body 100 illustrated in FIG. 1.

A portion that includes the third wiring portion 113 of the resin layer 101, the third wiring portion 123 of the resin layer 102, the third wiring portion 133 of the resin layer 103, the third wiring portion 143 of the resin layer 104, and the third wiring portion 153 of the resin layer 105 stacked on top of one another defines a third wiring portion 1003 (corresponding to "a third wiring portion") of the substrate main body 100 illustrated in FIG. 1.

A portion that includes the connecting portion 110 of the resin layer 101, the connecting portion 120 of the resin layer 102, the connecting portion 130 of the resin layer 103, the connecting portion 140 of the resin layer 104, and the connecting portion 150 of the resin layer 105 stacked on top of one another defines a connecting portion 1000 (corresponding to "a connecting portion") of the substrate main body 100 illustrated in FIG. 1.

As described above, the substrate main body 100 includes the first wiring portion 1001, the second wiring portion 1002, the third wiring portion 1003, and the connecting portion 1000. The first wiring portion 1001, the second wiring portion 1002, and the third wiring portion 1003 are connected to one another by the connecting portion 1000, and these portions are integrally provided.

Conductors each of which is provided in or on the substrate main body 100 will now be described.

Conductors 401, 511, 512, 513, 514, 611, 612, 711, and 712 are disposed on a surface of the resin layer 101. The conductors 511, 512, 513, 514, 611, 612, 711, and 712 each preferably have a rectangular or substantially rectangular shape, for example, when viewed in plan view, and the length of one side of each of the conductors 511, 512, 513, 514, 611, 612, 711, and 712 is preferably shorter than the width of each of the first wiring portion 111, the second wiring portion 112, and the third wiring portion 113.

The conductors 511, 512, 513, and 514 are spaced apart from one another on the side on which an end of the first wiring portion 111 that is farthest from the connecting portion 110 is disposed. These conductors are arranged in the order of the conductor 514, the conductor 513, the conductor 512, and the conductor 511 from the end of the first wiring portion 111, which is farthest from the connecting portion 110.

The conductors 611 and 612 are spaced apart from each other on the side on which an end of the second wiring portion 112 that is farthest from the connecting portion 110 is disposed. These conductors are arranged in the order of the conductor 612 and the conductor 611 from the end of the second wiring portion 112, which is farthest from the connecting portion 110.

The conductors 711 and 712 are spaced apart from each other on the side on which an end of the third wiring portion 113 that is farthest from the connecting portion 110 is disposed. These conductors are arranged in the order of the conductor 712 and the conductor 711 from the end of the third wiring portion 113, which is farthest from the connecting portion 110.

The conductor 401 extends over the connecting portion 110, the first wiring portion 111, the second wiring portion 112, and the third wiring portion 113. The conductor 401 is disposed over the entire or substantially the entire surface of the connecting portion 110. An end portion of the conductor 401 on the first wiring portion 111 is spaced apart from the conductor 511. An end portion of the conductor 401 on the second wiring portion 112 is spaced apart from the conductor 611. An end portion of the conductor 401 on the third wiring portion 113 is spaced apart from the conductor 711. The conductor 401 is disposed across the entire or substantially the entire width of each of the first wiring portion 111, the second wiring portion 112, and the third wiring portion 113.

A signal conductor 201 and conductors 522, 523, 524, 621, 622, 721, and 722 are disposed on a surface of the resin layer 102. The conductors 522, 523, 524, 621, 622, 721, and 722 each preferably have a rectangular or substantially rectangular shape, for example, when viewed in plan view, and the length of one side of each of the conductors 522, 523, 524, 621, 622, 721, and 722 is preferably shorter than the width of each of the first wiring portion 121, the second wiring portion 122, and the third wiring portion 123.

The conductors 522, 523, and 524 are spaced apart from one another on the side on which an end of the first wiring portion 121 that is farthest from the connecting portion 120 is disposed. These conductors are arranged in the order of the conductor 524, the conductor 523, and the conductor 522 from the end of the first wiring portion 121, which is farthest from the connecting portion 120. When viewed in plan view, the conductor 522 and the conductor 512 overlap each other, the conductor 523 and the conductor 513 overlap each other, and the conductor 524 and the conductor 514 overlap each other.

The conductors 621 and 622 are spaced apart from each other on the side on which an end of the second wiring portion 122 that is farthest from the connecting portion 120 is disposed. These conductors are arranged in the order of the conductor 622 and the conductor 621 from the end of the second wiring portion 122, which is farthest from the connecting portion 120. When viewed in plan view, the conductor 621 and the conductor 611 overlap each other, and the conductor 622 and the conductor 612 overlap each other.

The conductors 721 and 722 are spaced apart from each other on the side on which an end of the third wiring portion 123 that is farthest from the connecting portion 120 is disposed. These conductors are arranged in the order of the conductor 722 and the conductor 721 from the end of the third wiring portion 123, which is farthest from the connecting portion 120. When viewed in plan view, the conductor 721 and the conductor 711 overlap each other, and the conductor 722 and the conductor 712 overlap each other.

The signal conductor 201 is preferably a linear conductor having a predetermined width and extends over the first wiring portion 121 and the connecting portion 120. A portion of the signal conductor 201 on the connecting portion 120 is bent towards the second wiring portion 122. A first end portion of the signal conductor 201 in the extending direction of the signal conductor 201 is spaced apart from the conductor 522 by a predetermined distance. The first end portion of the signal conductor 201 in the extending direction and the conductor 511 overlap each other when viewed in plan view. The first end portion of the signal conductor 201 in the extending direction is connected to the conductor 511 by an interlayer connection conductor. A second end portion of the signal conductor 201 in the extending direction is located close to a portion of the connecting portion 120 that is continuous with the second wiring portion 122.

Signal conductors 202 and 302 and conductors 402, 533, 534, 632, and 732 are disposed on a surface of the resin layer 103. The conductors 533, 534, 632, and 732 each preferably have a rectangular or substantially rectangular shape, for example, when viewed in plan view, and the length of one side of each of the conductors 533, 534, 632, and 732 is preferably shorter than the width of each of the first wiring portion 131, the second wiring portion 132, and the third wiring portion 133.

The conductors 533 and 534 are spaced apart from each other on the side on which an end of the first wiring portion 131 that is farthest from the connecting portion 130 is disposed. These conductors are arranged in the order of the conductor 534 and the conductor 533 from the end of the first wiring portion 131, which is farthest from the connecting portion 130. When viewed in plan view, the conductor 533 overlaps the conductors 513 and 523, and the conductor 534 overlaps the conductors 514 and 524.

The conductor 632 is disposed on an end portion of the second wiring portion 132 that is farthest from the connecting portion 130 is disposed. When viewed in plan view, the conductor 632 overlaps the conductors 612 and 622.

The conductor 402 extends over the first wiring portion 131 and the connecting portion 130. The conductor 402 extends across the entire or substantially the entire width of the first wiring portion 131 and extends over the entire or substantially the entire surface of the connecting portion 130 excluding a portion of the connecting portion 130 that is continuous with the second wiring portion 132 and a portion of the connecting portion 130 that is continuous with the third wiring portion 133.

The signal conductor 202 is preferably a linear conductor having a predetermined width and extends over the connecting portion 130 and the second wiring portion 132. A first end portion of the signal conductor 202 that is located on the side on which the connecting portion 130 is disposed is adjacent to the conductor 402. The first end portion of the signal conductor 202, which is located on the side on which the connecting portion 130 is disposed, overlaps the second end portion of the signal conductor 201 when viewed in plan view. The first end portion of the signal conductor 202, which is located on the side on which the connecting portion 130 is disposed, and the second end portion of the signal conductor 201 are connected to each other by an interlayer connection conductor. The signal conductors 201 and 202 define a first signal conductor. A second end portion of the signal conductor 202 that is located on the side on which the second wiring portion 132 is disposed is adjacent to the conductor 632. The second end portion of the signal conductor 202, which is located on the side on which the second wiring portion 132 is disposed, overlaps the conductors 611 and 621 when viewed in plan view. The second end portion of the signal conductor 202, which is located on the side on which the second wiring portion 132 is disposed, and the conductors 611 and 621 are connected to one another by an interlayer connection conductor.

The signal conductor 302 is preferably a linear conductor having a predetermined width and extends over the connecting portion 130 and the third wiring portion 133. A first end portion of the signal conductor 302 that is located on the side on which the connecting portion 130 is disposed is adjacent to the conductor 402. The first end portion of the signal conductor 302, which is located on the side on which the connecting portion 130 is disposed, overlaps a second end portion of a signal conductor 301 (described later) when viewed in plan view. The first end portion of the signal conductor 302, which is located on the side on which the connecting portion 130 is disposed, and the second end portion of the signal conductor 301 are connected to each other by an interlayer connection conductor. The signal conductors 301 and 302 define a second signal conductor. A second end portion of the signal conductor 302 that is located on the side on which the third wiring portion 133 is disposed is adjacent to the conductor 732. The second end portion of the signal conductor 302, which is located on the side on which the third wiring portion 133 is disposed, overlaps the conductors 711 and 721 when viewed in plan view. The second end of the signal conductor 302, which is located on the side on which the third wiring portion 133 is disposed, and the conductors 711 and 721 are connected to one another by an interlayer connection conductor.

The signal conductor 301 and conductors 544, 642, and 742 are disposed on a surface of the resin layer 104. The conductors 544, 642, and 742 each preferably have a rectangular or substantially rectangular shape, for example, when viewed in plan view, and the length of one side of each of the conductors 544, 642, and 742 is preferably shorter than the width of each of the first wiring portion 141, the second wiring portion 142, and the third wiring portion 143.

The conductor 544 is disposed on an end portion of the first wiring portion 141 that is farthest from the connecting portion 140. The conductor 544 overlaps the conductors 514, 524, and 534 when viewed in plan view.

The conductor 642 is disposed on an end portion of the second wiring portion 142 that is farthest from the connecting portion 140. The conductor 642 overlaps the conductors 612, 622, and 632 when viewed in plan view.

The conductor 742 is disposed on an end portion of the third wiring portion 143 that is farthest from the connecting portion 140. The conductor 742 overlaps the conductors 712, 722, and 732 when viewed in plan view.

The signal conductor 301 is preferably a linear conductor having a predetermined width and is extended over the first wiring portion 141 and the connecting portion 140. A portion of the signal conductor 301 on the connecting portion 140 is bent towards the third wiring portion 143. A first end portion of the signal conductor 301 in the extending direction of the signal conductor 301 is spaced apart from the conductor 544 by a predetermined distance. The first end portion of the signal conductor 301 in the extending direction overlaps the conductors 513, 523, and 533 when viewed in plan view. The first end portion of the signal conductor 301 in the extending direction and the conductors 513, 523, and 533 are connected to one another by an interlayer connection conductor. A second end portion of the signal conductor 301 in the extending direction is located close to a portion of the connecting portion 140 that is continuous with the third wiring portion 143. The second end portion of the signal conductor 301 in the extending direction overlaps the first end portion of the signal conductor 302, which is located on the side on which the connecting portion 130 is disposed, when viewed in plan view. The second end portion of the signal conductor 301 in the extending direction and the first end portion of the signal conductor 302, which is located on the side on which the connecting portion 130 is disposed, are connected to each other by an interlayer connection conductor.

A conductor 403 is disposed on a surface of the resin layer 105. The conductor 403 is disposed over the entire or substantially the entire surface of the resin layer 105. An end potion of the conductor 403 that is located on the first wiring portion 151 and that is located on the side opposite to the side on which the connecting portion 150 is disposed is connected to the conductors 514, 524, 534, and 544 by an interlayer connection conductor. An end portion of the conductor 403 that is located on the second wiring portion 152 and that is located on the side opposite to the side on which the connecting portion 150 is disposed is connected to the conductors 612, 622, 632, and 642 by an interlayer connection conductor. An end portion of the conductor 403 that is located on the third wiring portion 153 and that is located on the side opposite to the side on which the connecting portion 150 is disposed is connected to the conductors 712, 722, 732, and 742 by an interlayer connection conductor.

In such a configuration, by using the conductors 401, 402, and 403 as ground conductors, a first signal line that includes the first signal conductor including the signal conductors 201 and 202 and a second signal line that includes the second signal conductor including the signal conductors 301 and 302, the first signal line and the second signal line each having a stripline configuration, are provided in the resin multilayer substrate 10. In this case, in the first wiring portion 1001, the signal conductor 201 and the signal conductor 301 are aligned and superposed with each other in a lamination direction in which the plurality of resin layers are laminated together, and thus, a plurality of signal conductors are able to be provided without increasing the width of the first wiring portion 1001. In addition, since the conductor 402, which defines and functions as a ground conductor, is disposed between the signal conductor 201 and the signal conductor 301, the probability that the signal conductor 201 and the signal conductor 301 will have an electromagnetic field coupling relationship is reduced, and the isolation between the first signal line and the second signal line is ensured.

As illustrated in FIG. 1, the insulating protective film 801 is disposed on a surface (the mounting surface) of the substrate main body 100, which is configured as described above. The insulating protective film 801 preferably includes a plurality of holes. More specifically, the insulating protective film 801 includes the plurality of holes provided at positions overlapping the conductors 511, 512, 513, 514, 611, 612, 711, and 712. Some of the plurality of holes of the insulating protective film 801 are provided at positions corresponding to the end portions of the conductor 401, each of which is located close to one of the conductors 511, 611, and 711. Some of the plurality of holes of the insulating protective film 801 are provided at positions overlapping the connecting portion 1000, a position overlapping a peripheral portion of an end portion of the first wiring portion 1001 that is continuous with the connecting portion 1000, and a position overlapping a peripheral portion of a first end portion of the second wiring portion 1002 that is continuous with the connecting portion 1000, all the positions overlapping the conductor 401.

The connector 81 is disposed on a second end portion of the second wiring portion 1002 that is opposite to the first end portion of the second wiring portion 1002, which is continuous with the connecting portion 1000. A central conductor (not illustrated) of the connector 81 is connected to the conductor 611 through one of the holes provided in the insulating protective film 801. An outer-peripheral conductor (not illustrated) of the connector 81 is connected to the conductor 612 and the conductor 401 through at least one of the holes provided in the insulating protective film 801.

The connector 82 is disposed on an end portion of the third wiring portion 1003 that is farthest from the connecting portion 1000. A central conductor (not illustrated) of the connector 82 is connected to the conductor 711 through one of the holes provided in the insulating protective film 801. An outer-peripheral conductor (not illustrated) of the connector 82 is connected to the conductor 712 and the conductor 401 through at least one of the holes provided in the insulating protective film 801.

In such a configuration, a first end portion of the first signal conductor, which includes the signal conductors 201 and 202, corresponds to a first external connection terminal and is defined by a contact pad at which the conductor 511 is exposed. A second end portion of the first signal conductor corresponds to a second external connection terminal and is defined by the connector 81.

A first end portion of the second signal conductor, which includes the signal conductors 301 and 302, corresponds to the first external connection terminal and is defined by a contact pad at which the conductor 513 is exposed. A second end portion of the second signal conductor corresponds to a third external connection terminal and is defined by the connector 82.

The conductors 512, 514, 612, and 712 are connected to the conductors 402 and 403, which are ground conductors, and thus, the conductors 512, 514, 612, and 712 define and function as ground terminals.

Since the conductor 401 is a ground conductor, the conductors 515 and 810 that are exposed through the holes provided at the positions overlapping the conductor 401 as illustrated in FIG. 1 are ground terminals. In addition, these conductors 515 and 810 also define and function as auxiliary mounting conductors. In other words, the conductors that are positioned between the conductor 511 and the connector 81, which are external connection terminals, in the direction in which the first signal conductor extends (the extending direction defined by the signal conductors 201 and 202), and that are exposed at the surface of the substrate main body 100 are auxiliary mounting conductors. Similarly, the conductors that are positioned between the conductor 513 and the connector 82, which are external connection terminals, in the direction in which the second signal conductor extends (the extending direction defined by the signal conductors 301 and 302), and that are exposed at the surface of the substrate main body 100 are auxiliary mounting conductors.

Figure 3:
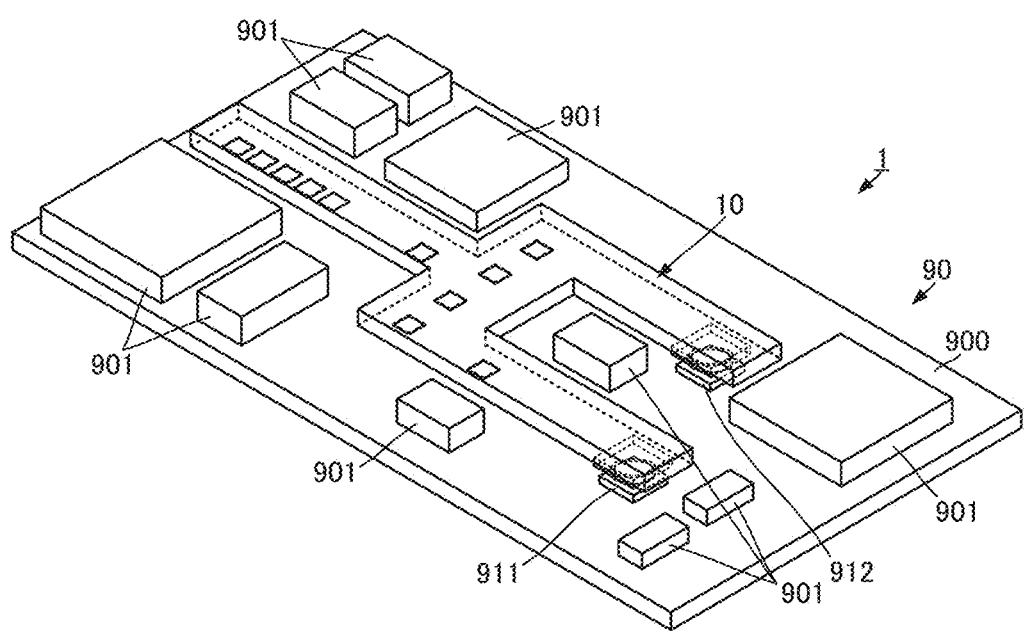
FIG. 3 is an external perspective view of an electronic device according to the first preferred embodiment of the present invention.
Figure 4:
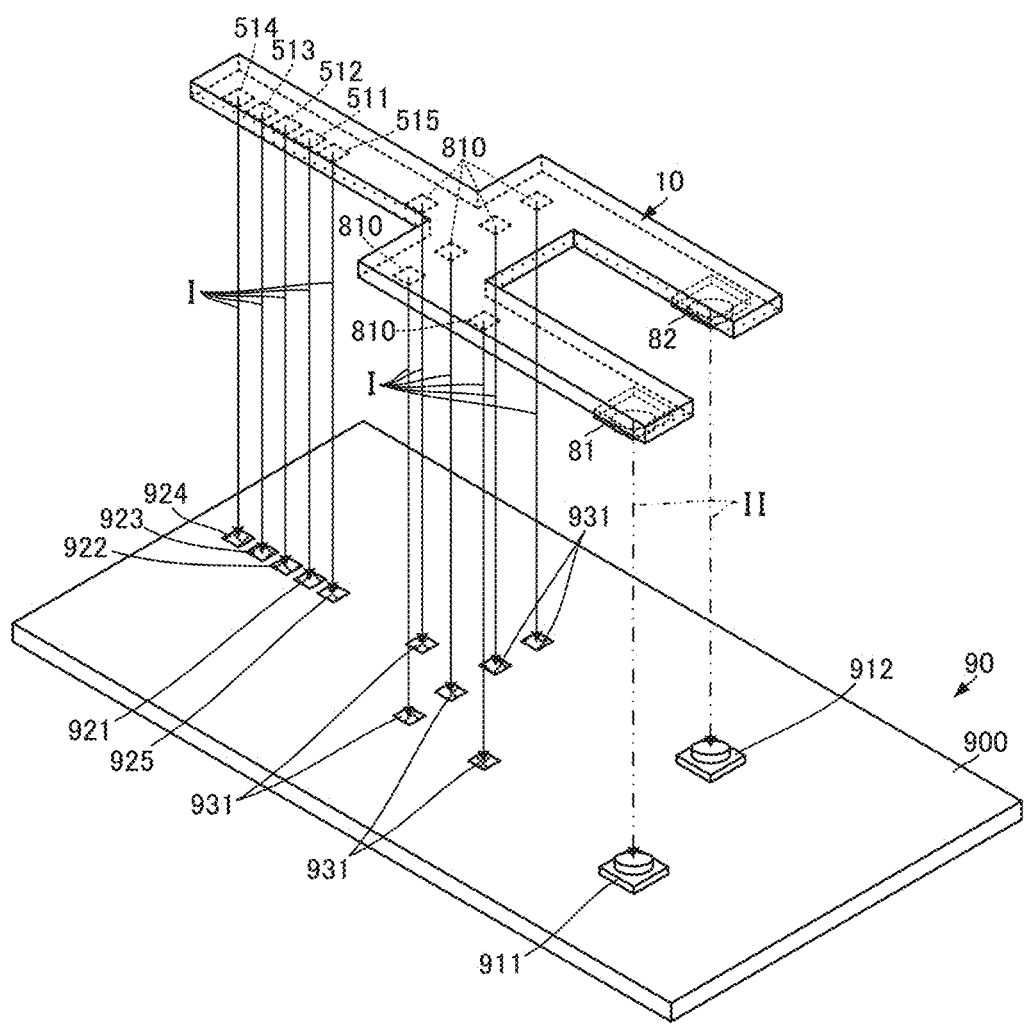
FIG. 4 is an exploded perspective view of an electronic device according to the first preferred embodiment of the present invention.

The resin multilayer substrate 10 having such a configuration is mounted on a circuit board in the following manner, and an electronic device is provided. FIG. 3 is an external perspective view of the electronic device according to the first preferred embodiment of the present invention. FIG. 4 is an exploded perspective view of the electronic device according to the first preferred embodiment of the present invention. Note that mounting components are not illustrated in FIG. 4. In addition, the reference characters I and II in FIG. 4 indicate a mounting order.

As illustrated in FIG. 3 and FIG. 4, an electronic device 1 includes the resin multilayer substrate 10 and a circuit board 90. The circuit board 90 includes a board 900, a plurality of mounting components 901, and circuit-board-side connectors 911 and 912. The plurality of mounting components 901 and the circuit-board-side connectors 911 and 912 are mounted on a surface of the board 900. Mounting land conductors 921, 922, 923, 924, 925, and 931 are disposed on the surface of the board 900.

The conductors 511, 512, 513, 514, and 515 of the resin multilayer substrate 10 are respectively and directly connected to the mounting land conductors 921, 922, 923, 924, and 925 of the circuit board 90 with, for example, solder. The conductors 810 of the resin multilayer substrate 10 are respectively and directly connected to the mounting land conductors 931 of the circuit board 90 with, for example, solder.

The connectors 81 and 82 of the resin multilayer substrate 10 are respectively connected to the circuit-board-side connectors 911 and 912 of the circuit board 90.

As described above, in the electronic device 1 according to the first preferred embodiment, the external connection terminals of the first wiring portion 1001 of the resin multilayer substrate 10 are directly connected to the circuit board 90 with, for example, solder, and the external connection terminals of the second and third wiring portions 1002 and 1003 are connected to the circuit board 90 via the connectors 81 and 82.

The electronic device 1 is manufactured by the following non-limiting example of a method. First, as indicated by the reference character I in FIG. 4, the external connection terminals of the resin multilayer substrate 10 are directly connected to the mounting land conductors of the circuit board 90 with, for example, solder. As a result, the first wiring portion 1001 of the resin multilayer substrate 10 is fixed to the circuit board 90.

Next, as indicated by the reference character II in FIG. 4, the connectors 81 and 82 of the resin multilayer substrate 10 are mounted on the circuit-board-side connectors 911 and 912 of the circuit board 90. In this case, since the first wiring portion 1001 of the resin multilayer substrate 10 is fixed to the circuit board 90, mounting of the connectors 81 and 82 is able to be easily performed. In addition, since the first wiring portion 1001 of the resin multilayer substrate 10 is not a connector, the first wiring portion 1001 will not become detached from the circuit board 90 as a result of performing the mounting of the connectors 81 and 82. Therefore, the connection reliability between the resin multilayer substrate 10 and the circuit board 90 is improved.

In addition, in the configuration according to the first preferred embodiment, the conductors 515 and 810, which are auxiliary mounting conductors, are disposed between the connectors 81 and 82 and the conductors 511 and 513. These conductors 515 and 810 are connected to the mounting land conductors 925 and 931 of the circuit board 90 together with the conductors 511 and 513 with, for example, solder. As a result, when the connectors 81 and 82 are mounted on the circuit-board-side connectors 911 and 912, even if stress is generated in the resin multilayer substrate 10, the stress being, for example, a force that pulls the resin multilayer substrate 10 towards the connectors 81 and 82, the probability that this stress will be applied to the conductors 511 and 513, which are the external connection terminals, is reduced by fixing the conductors 515 and 810 on the mounting land conductors 925 and 931, and the connection reliability is further improved. In particular, by connecting the conductors 515 and 810, which are auxiliary mounting conductors, to the mounting land conductors 925 and 931 with, for example, solder before the connectors 81 and 82 are mounted onto the circuit-board-side connectors 911 and 912, the reliability is further improved. In this case, it is preferable that the conductors 515 and 810, which are auxiliary mounting conductors, be soldered at the same time as the conductors 511 and 513, which define the external connection terminals, are soldered, and as a result, a soldering process is simplified.

Note that the process of mounting the mounting components 901 on the circuit board 90 and the process of connecting (mounting) the resin multilayer substrate 10 to the circuit board 90 with, for example, solder may be performed at different times or may be performed at the same time. In the case of performing these processes at the same time, one manufacturing process is able to be omitted, and the process for manufacturing the electronic device 1 is simplified.

Figure 5:
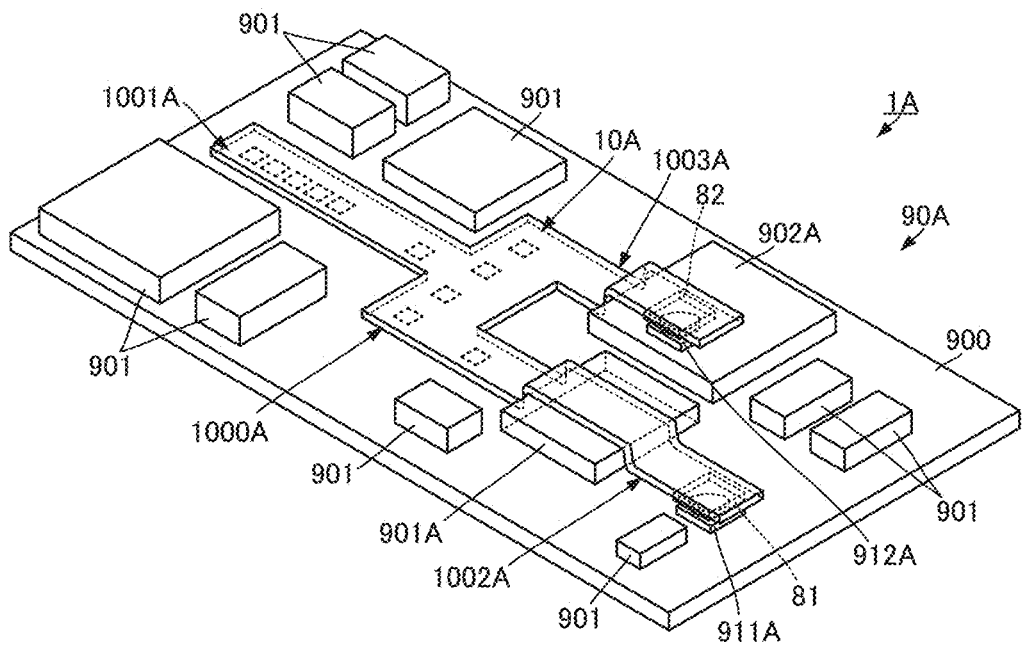
FIG. 5 is an external perspective view illustrating an electronic device according to the first preferred embodiment of the present invention.

FIG. 3 and FIG. 4 illustrate a configuration in which the resin multilayer substrate 10 is disposed in a planar manner with respect to the circuit board 90. However, a configuration illustrated in FIG. 5 may also be provided. FIG. 5 is an external perspective view illustrating another configuration of an electronic device according to the first preferred embodiment of the present invention.

As illustrated in FIG. 5, an electronic device 1A includes a resin multilayer substrate 10A and a circuit board 90A. The basic structure of the resin multilayer substrate 10A is the same or substantially the same as that of the resin multilayer substrate 10, and the resin multilayer substrate 10A is different from the resin multilayer substrate 10 in terms of dimensions. The basic structure of the circuit board 90A is the same or substantially the same as that of the circuit board 90 with the exception of the arrangement of mounting components 901A and 902A and the arrangement of circuit-board-side connectors 911A and 912A.

A second wiring portion 1002A of the resin multilayer substrate 10A covers side surfaces and a top surface of the mounting component 901A and extends across the top surface, and the connector 81 of the second wiring portion 1002A is mounted on the circuit-board-side connector 911A.

A third wiring portion 1003A of the resin multilayer substrate 10A partially covers a side surface and a top surface of the mounting component 902A, and the connector 82 of the third wiring portion 1003A is mounted on the circuit-board-side connector 912A that is disposed on the top surface of the mounting component 902A.

With this configuration, a first wiring portion 1001A and a connecting portion 1000A are fixed to the circuit board 90A with, for example, solder. Therefore, the resin multilayer substrate 10A is able to be easily disposed in accordance with the shapes of the mounting components 901A and 902A, and the connectors 81 and 82 are able to be easily mounted on the circuit-board-side connectors 911A and 912A.

Note that if there is no auxiliary mounting conductor on the connecting portion 1000A, advantageous effects similar to those described above are obtained as long as the first wiring portion 1001A is fixed to the circuit board 90A with, for example, solder. However, by also providing auxiliary mounting conductors on the connecting portion 1000A, positioning of the resin multilayer substrate 10A with respect to the circuit board 90A is able to be even more easily performed.

In addition, as in the configuration according to the first preferred embodiment, by providing the conductors 810, which are auxiliary mounting conductors, on the third wiring portion 1003A, on which the connector 81 is disposed, and fixing the conductors 810 on the circuit board 90A with, for example, solder, the probability that stress will be applied to the connecting portion 1000A and the first wiring portion 1001A is reduced, and the reliability is further improved.

Furthermore, by including a plurality of auxiliary mounting conductors as described above, the positioning effect and the effect of reducing stress, which have been mentioned above, are further improved.

As described above, by providing the configuration according to the first preferred embodiment, even if there are irregularities in a region of the circuit board 90A in which the resin multilayer substrate 10A is disposed (mounted), the resin multilayer substrate 10A is able to be easily mounted onto the circuit board 90A.

Figure 6:
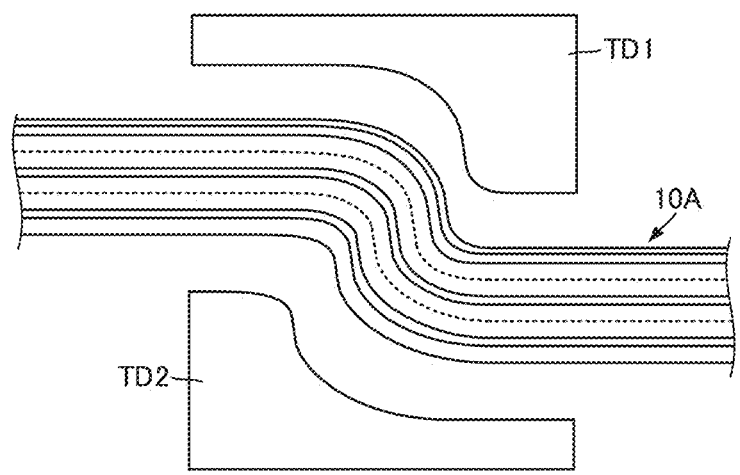
FIG. 6 is a side view schematically illustrating bending that is performed on a resin multilayer substrate according to the first preferred embodiment of the present invention.

Note that, in this case, it is preferable to perform bending, for example, as illustrated in FIG. 6. FIG. 6 is a side view schematically illustrating bending that is performed on a resin multilayer substrate according to the first preferred embodiment of the present invention.

As illustrated in FIG. 6, a portion of the resin multilayer substrate 10A, which includes the resin layers each of which is preferably made of a thermoplastic resin, for example, that is to be a bent portion is clamped between bending dies TD1 and TD2, heated, and then cooled so as to become plastically deformed. As a result, the resin multilayer substrate 10A is able to have a bent portion corresponding to the shapes of the bending dies TD1 and TD2.

The bent portion may be applied to, for example, portions of the resin multilayer substrate 10A illustrated in FIG. 5 that are brought into contact with the mounting components 901A and 902A. As a result, the resin multilayer substrate 10A is able to be even more easily mounted on the circuit board 90A.

Figure 7:
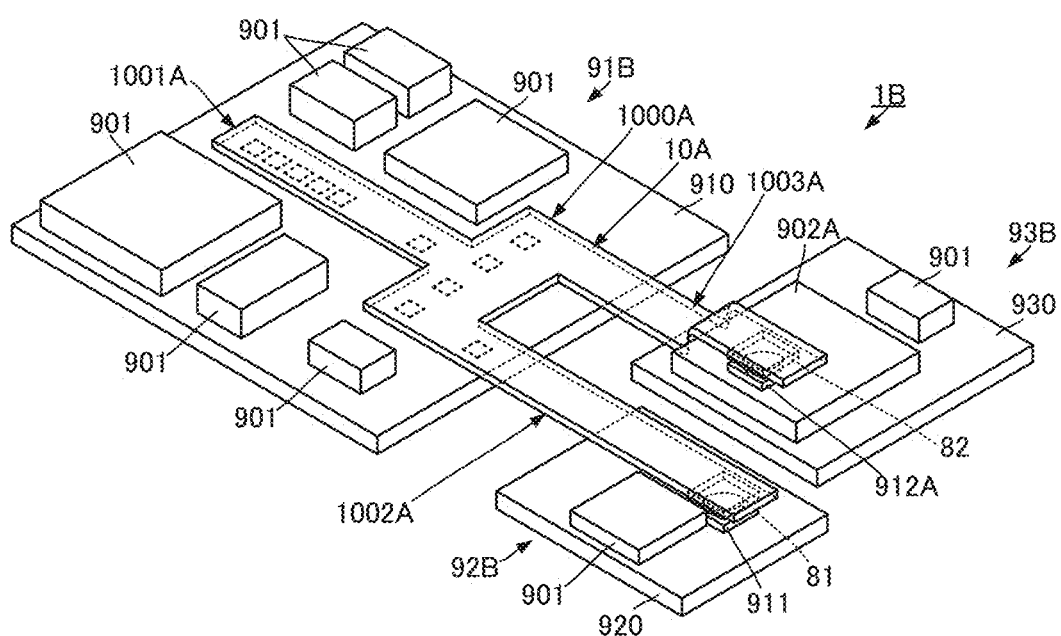
FIG. 7 is an external perspective view illustrating an electronic device according to the first preferred embodiment of the present invention.

Although each of FIG. 3, FIG. 4, and FIG. 5 illustrates a configuration in which the resin multilayer substrate is mounted on a single circuit board, the resin multilayer substrate may also be mounted so as to connect a plurality of circuit boards. FIG. 7 is an external perspective view illustrating a configuration of an electronic device according to the first preferred embodiment of the present invention.

An electronic device 1B includes the resin multilayer substrate 10A and a plurality of circuit boards 91B, 92B, and 93B. The circuit boards 91B, 92B, and 93B are independent of one another and are spaced apart from one another.

The circuit board 91B includes a board 910 on which the mounting components 901 are mounted. External connection terminals defined by conductors that are disposed on the first wiring portion 1001A and the connecting portion 1000A of the resin multilayer substrate 10A are connected to the circuit board 91B.

The circuit board 92B includes a board 920 on which one of the mounting components 901 and the circuit-board-side connector 911 are mounted. The connector 81 of the second wiring portion 1002A of the resin multilayer substrate 10A is mounted on the circuit-board-side connector 911 of the circuit board 92B.

The circuit board 93B includes a board 930 on which one of the mounting components 901 and a mounting component 902A are mounted. The circuit-board-side connector 912A is mounted on a top surface of the mounting component 902A. The connector 82 of the third wiring portion 1003A of the resin multilayer substrate 10A is mounted on the circuit-board-side connector 912A of the circuit board 93B.

In such a configuration, first, the first wiring portion 1001A and the connecting portion 1000A of the resin multilayer substrate 10A are mounted on the circuit board 91B such that the resin multilayer substrate 10A is fixed on the circuit board 91B. Next, the connector 81 of the second wiring portion 1002A of the resin multilayer substrate 10A is mounted on the circuit-board-side connector 911 of the circuit board 92B, and the connector 82 of the third wiring portion 1003A of the resin multilayer substrate 10A is mounted on the circuit-board-side connector 912A of the circuit board 93B.

By providing such a connection configuration, while one end portion of the resin multilayer substrate 10A is connected and fixed to a circuit board, the other end portions of the resin multilayer substrate 10A are configured so as to be connected to other circuit boards, such that a connection operation is able to be easily performed even if the end portions of the resin multilayer substrate 10A are connected to different circuit boards. In addition, when the resin multilayer substrate 10A is connected to the circuit boards 92B and 93B after being connected to the circuit board 91B, the resin multilayer substrate 10A and the circuit board 91B are prevented from being disconnected from each other. Furthermore, as described above, even if stress is generated when the resin multilayer substrate 10A is connected to the circuit boards 92B and 93B, the resin multilayer substrate 10A and the circuit board 91B are connected to each other by the auxiliary mounting conductors, and thus, the probability that this stress will be applied to the external connection terminals of the resin multilayer substrate 10A connected to the circuit board 91B is effectively reduced. As a result, the connection reliability between the resin multilayer substrate 10A and the circuit board 91B is improved. Therefore, the electronic device 1B in which the connection reliability between the circuit boards 91B, 92B, and 93B is high is provided.

Note that, in the configuration illustrated in FIG. 7, although connectors are preferably provided for the connection of the resin multilayer substrate 10A and the circuit board 92B and the connection of the resin multilayer substrate 10A and the circuit board 93B, a connector may be provided for only one of the connection of the resin multilayer substrate 10A and the circuit board 92B and the connection of the resin multilayer substrate 10A and the circuit board 93B. However, as illustrated in FIG. 7, in the case in which connection using a conductor is performed at one position, a connection operation is able to be even more easily performed as compared to the case in which connection using a conductor is performed at a plurality of positions.

Note that, in the above-described configuration, an external connection terminal to which a conductor is directly connected with, for example, solder and an external connection terminal to which a conductor is connected by using a connector are provided on the same surface of the resin multilayer substrate 10. However, a surface on which an external connection terminal to which a conductor is directly connected with, for example, solder is provided and a surface on which an external connection terminal to which a conductor is connected by using a connector is provided may be different surfaces of the resin multilayer substrate 10 (the opposite surfaces of the resin multilayer substrate 10). This case is effective in the configuration illustrated in FIG. 7 when, for example, a mounting surface of the circuit board 91B and mounting surfaces of the circuit boards 92B and 93B face in opposite directions.

However, the configuration in which an external connection terminal to which a conductor is directly connected with, for example, solder and an external connection terminal to which a conductor is connected by using a connector are provided on the same surface is effective when the resin multilayer substrate 10 is used as a mounting component for a surface mount technology (SMT) (a surface mount device (SMD)).

Figure 8:
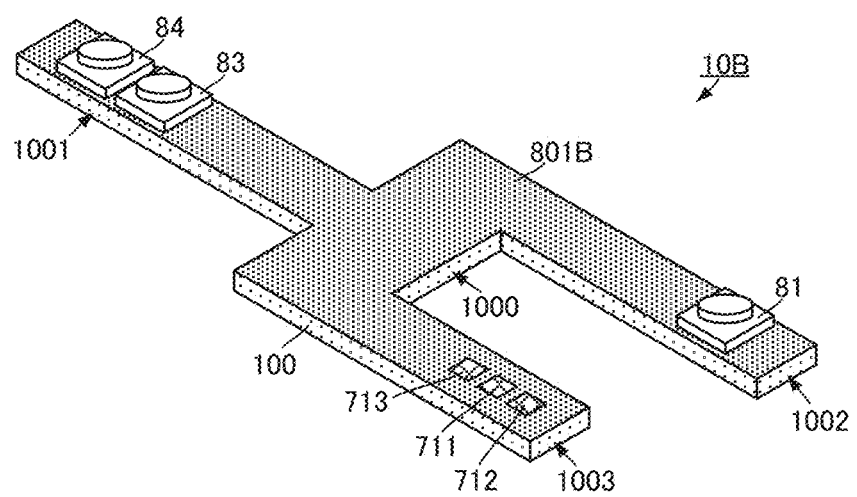
FIG. 8 is an external perspective view of a resin multilayer substrate according to a second preferred embodiment of the present invention.

A resin multilayer substrate according to a second preferred embodiment of the present invention will now be described with reference to the drawings. FIG. 8 is an external perspective view of the resin multilayer substrate according to the second preferred embodiment of the present invention. In a resin multilayer substrate 10B according to the second preferred embodiment, the arrangement of connectors is different from that in the resin multilayer substrate 10 according to the first preferred embodiment. The substrate main body 100 of the resin multilayer substrate 10B is the same as the substrate main body 100 of the resin multilayer substrate 10, and description thereof will be omitted.

The resin multilayer substrate 10B includes the substrate main body 100, an insulating protective film 801B, and connectors 81, 83, and 84.

The insulating protective film 801B includes a plurality of holes. More specifically, the insulating protective film 801B includes the plurality of holes provided at positions overlapping the conductors 511, 512, 513, 514, 611, 612, 711, and 712. Some of the plurality of holes of the insulating protective film 801B are provided at positions corresponding to the end portions of the conductor 401 each of which is located close to one of the conductors 511, 611, and 711.

The connector 81 is disposed on an end portion of the second wiring portion 1002 that is farthest from the connecting portion 1000. A central conductor (not illustrated) of the connector 81 is connected to the conductor 611 through one of the holes provided in the insulating protective film 801B. An outer-peripheral conductor (not illustrated) of the connector 81 is connected to the conductor 612 and the conductor 401 through at least one of the holes provided in the insulating protective film 801.

The connectors 83 and 84 are aligned and disposed on an end portion of the first wiring portion 1001 that is farthest from the connecting portion 1000. A central conductor (not illustrated) of the connector 83 is connected to the conductor 511 (see FIG. 2) through one of the holes provided in the insulating protective film 801B. An outer-peripheral conductor (not illustrated) of the connector 83 is connected to the conductor 512 (see FIG. 2) and the conductor 401 through at least one of the holes provided in the insulating protective film 801B. A central conductor (not illustrated) of the connector 84 is connected to the conductor 513 (see FIG. 2) through one of the holes provided in the insulating protective film 801B. An outer-peripheral conductor (not illustrated) of the connector 83 is connected to the conductors 512 and 514 (see FIG. 2) through at least one of the holes provided in the insulating protective film 801B.

In such a configuration, the first end of the first signal conductor, which includes the signal conductors 201 and 202, corresponds to the first external connection terminal and is defined by the connector 83. The second end of the first signal conductor corresponds to the second external connection terminal and is defined by the connector 81.

The first end of the second signal conductor, which includes the signal conductors 301 and 302, corresponds to the first external connection terminal and is defined by the connector 84. The second end of the second signal conductor corresponds to the third external connection terminal and is defined by a contact pad at which the conductor 711 is exposed.

In the resin multilayer substrate 10B according to the second preferred embodiment, the external connection terminals of the first wiring portion 1001, in which a plurality of signal conductors are arranged in the lamination direction, may preferably be defined by connectors, and the external connection terminal of the third wiring portion 1003, in which a single signal conductor is disposed, may preferably be defined by a conductor that is exposed at a surface. Note that the external connection terminal of the second wiring portion 1002 may be defined by a conductor that is exposed at a surface.

Figure 9A:
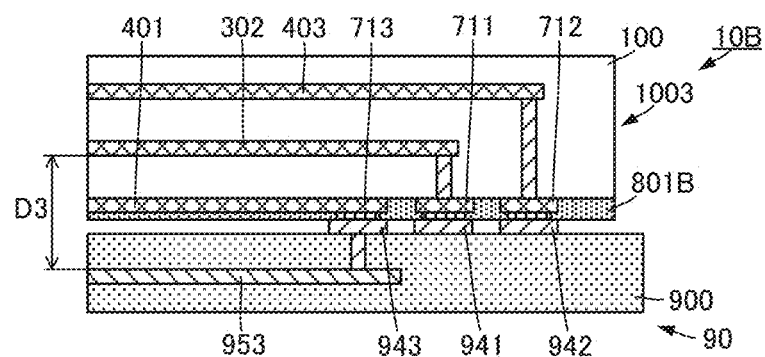
FIGS. 9A and 9B are cross-sectional side views each schematically illustrating a connection structure between the resin multilayer substrate according to the second preferred embodiment of the present invention and a circuit board.
Figure 9B:
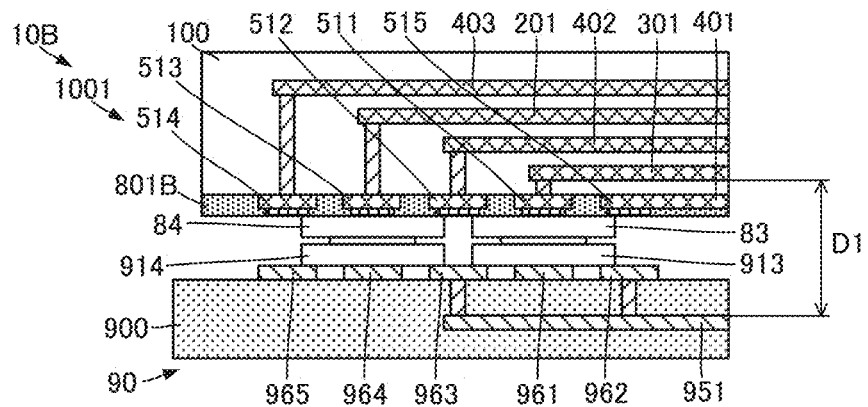

In addition, with the structure of the resin multilayer substrate 10B according to the second preferred embodiment, the following electrical characteristics are obtained. FIGS. 9A and 9B are cross-sectional side views each schematically illustrating a connection structure between the resin multilayer substrate according to the second preferred embodiment and a circuit board.

FIG. 9A illustrates the structure of the third wiring portion 1003 of the resin multilayer substrate 10B. FIG. 9B illustrates the structure of the first wiring portion 1001 of the resin multilayer substrate 10B.

As illustrated in FIGS. 9A and 9B, the circuit board 90 includes the board 900, mounting land conductors 941, 942, 943, 961, 962, 963, 964, and 965, and circuit conductors 951 and 953.

Each of the mounting land conductors 941, 942, 943, 961, 962, 963, 964, and 965 is disposed on the surface of the board 900. Each of the circuit conductors 951 and 953 is built into the board 900 and extends in a direction parallel or substantially parallel to the surface.

As illustrated in FIG. 9A, the conductors 711, 712, and 713 of the resin multilayer substrate 10B are respectively and directly connected to the mounting land conductors 941, 942, and 943 with, for example, solder.

As illustrated in FIG. 9B, the conductors 511, 512, and 515 of the resin multilayer substrate 10B are connected to the connector 83. The connector 83 is mounted on a circuit-board-side connector 913. The circuit-board-side connector 913 is connected to the mounting land conductors 961, 962, and 963. The conductors 513, 512, and 514 of the resin multilayer substrate 10B are connected to the connector 84. The connector 84 is mounted on a circuit-board-side connector 914. The circuit-board-side connector 914 is connected to the mounting land conductors 964, 963, and 965.

As described above, in the third wiring portion 1003 in which a relatively small number of conductors are provided in the lamination direction of the resin layers of the substrate main body 100 and in which the conductors are disposed with a large gap therebetween, the resin multilayer substrate 10B is directly connected to the circuit board 90 by the conductors. In contrast, in the first wiring portion 1001 in which a relatively large number of conductors are provided in the lamination direction of the resin layers of the substrate main body 100 and in which the conductors are disposed with a small gap therebetween, the resin multilayer substrate 10B is connected to the circuit board 90 via the connectors.

With this configuration, a distance D1 between the signal conductor 301 of the first wiring portion 1001, the signal conductor 301 being closer to the mounting surface than the signal conductor 201 is, and the circuit conductor 951 of the circuit board 90 is able to be increased by the connectors. In contrast, if such connectors are not used, the distance between the signal conductor 301 and the circuit conductor 951 of the circuit board 90 will be relatively small. By using connectors as described above, even if the signal conductor 301 of the resin multilayer substrate 10B is close to the mounting surface, and the signal conductor 301 and the circuit conductor 951 of the circuit board 90 extend so as to be parallel or substantially parallel to each other, the probability that these conductors will have an undesirable electromagnetic field coupling relationship is effectively reduced.

The signal conductor 302 of the third wiring portion 1003 is farther away from the mounting surface than is the signal conductor 301 of the first wiring portion 1001. Thus, a distance D3 between the signal conductor 302 and the circuit conductor 953 is large. As a result, even if the signal conductor 302 of the resin multilayer substrate 10B and the circuit conductor 953 of the circuit board 90 extend so as to be parallel or substantially parallel to each other, the probability that these conductors will have an undesirable electromagnetic field coupling relationship is effectively reduced. Note that, in the configuration according to the second preferred embodiment, preferably, the first wiring portion 1001 has a structure in which the conductors are stacked in five layers, and the third wiring portion 1003 has a structure in which the conductors including the signal conductor 302 are stacked in three layers. Therefore, with this configuration, the distance between the signal conductor 302 and the circuit conductor 953 is able to be easily increased.

As described above, with the configuration according to the second preferred embodiment, even if the signal conductors of the resin multilayer substrate 10B and the circuit conductors of the circuit board 90 extend so as to be parallel or substantially parallel to each other, the probability that these conductors will have an undesirable electromagnetic field coupling relationship is effectively reduced.

Note that, similar to the first preferred embodiment, a plurality of auxiliary mounting conductors may be provided in the configuration according to the second preferred embodiment which is illustrated in FIG. 8. As a result, advantageous effects similar to those of the first preferred embodiment are obtained.

Figure 10:
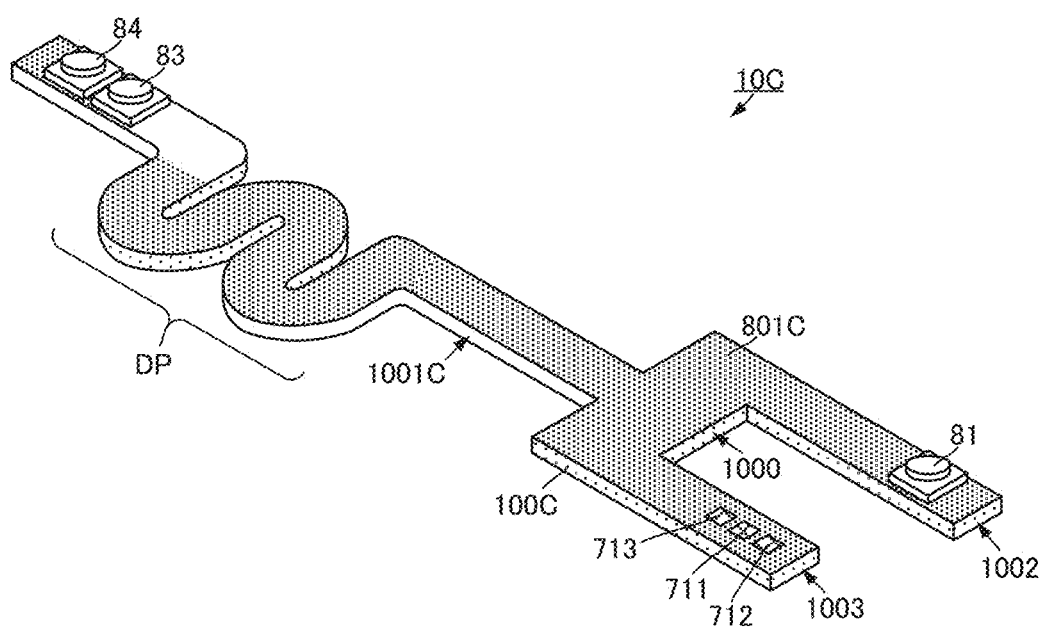
FIG. 10 is an external perspective view of a resin multilayer substrate according to a third preferred embodiment of the present invention.

A resin multilayer substrate according to a third preferred embodiment of the present invention will now be described with reference to the drawings. FIG. 10 is an external perspective view of the resin multilayer substrate according to the third preferred embodiment of the present invention. The difference between a resin multilayer substrate 10C according to the third preferred embodiment and the resin multilayer substrate 10B according to the second preferred embodiment is that the resin multilayer substrate 10C includes a buffering portion DP. The remaining configuration of the resin multilayer substrate 10C is the same or substantially the same as that of the resin multilayer substrate 10B according to the second preferred embodiment, and repeated descriptions will be omitted.

The resin multilayer substrate 10C includes a substrate main body 100C. The substrate main body 100C includes a first wiring portion 1001C. The first wiring portion 1001C includes the buffering portion DP. The buffering portion DP is defined by a portion of the first wiring portion 1001C that extends in a serpentine manner.

With such a configuration, the first wiring portion 1001C may easily extend and retract in a main extending direction, that is, a direction connecting the positions of the external connection terminals (the positions at which the connectors 83 and 84 are disposed) and an end portion of the first wiring portion 1001C that is continuous with the connecting portion 1000C. In addition, when viewed in plan view, each of the connectors 83 and 84 is able to be arranged at an angle with respect to the main extending direction. This increases the arrangement options for the connectors 83 and 84, and the resin multilayer substrate 10C is able to be even more easily mounted on a circuit board.

Note that the buffering portion DP may be included in one of the other wiring portions (corresponding to the second wiring portion 1002 and the third wiring portion 1003 in FIG. 10) as long as the buffering portion DP is located between an external connection terminal defined by a connector and an external connection terminal defined by a conductor. However, a portion in which a larger number of conductors are provided in the lamination direction (a portion in which the ratio of the total thickness of the conductors to the total thickness of the resin layers in the lamination direction is large) has a modulus of elasticity that is higher than that of a portion in which a smaller number of conductors are provided in the lamination direction. Accordingly, providing the buffering portion DP so as to be included in the portion in which a larger number of conductors are provided in the lamination direction facilitates changes in the overall shape. Therefore, the buffering portion DP provides greater advantageous effects when included in the first wiring portion 1001C.

Note that, similar to the first preferred embodiment, a plurality of auxiliary mounting conductors may be provided in the configuration according to the third preferred embodiment which is illustrated in FIG. 10. As a result, advantageous effects similar to those of the first preferred embodiment are obtained. In this case, the auxiliary mounting conductors may at least be disposed on the side opposite to the side on which the connectors 84 and 93 are disposed with the buffering portion DP interposed between the auxiliary mounting conductors and the connectors 84 and 93 and so as to be located between the buffering portion DP and the conductor 711, which defines an external connection terminal.

In each of the above-described preferred embodiments, although configurations have been described in which two signal conductors preferably are provided in the lamination direction in the first wiring portion, the above-described configurations may be applied to a configuration in which the two signal conductors are provided in the width direction of the first wiring portion, which is a direction perpendicular or substantially perpendicular to the lamination direction.

In addition, in each of the above-described preferred embodiments, although a configuration has been described in which two signal conductors are included in the first wiring portion of the resin multilayer substrate, three or more signal conductors may be included in the first wiring portion. For example, a configuration in which a fourth wiring portion and a fifth wiring portion are provided in addition to the first wiring portion, the second wiring portion, and the third wiring portion, and in which these wiring portions are connected to one another by a connecting portion may be provided, and the first wiring portion may include signal conductors that are connected to the second connecting portion, the third connecting portion, the fourth connecting portion, and the fifth connecting portion.

Figure 11:
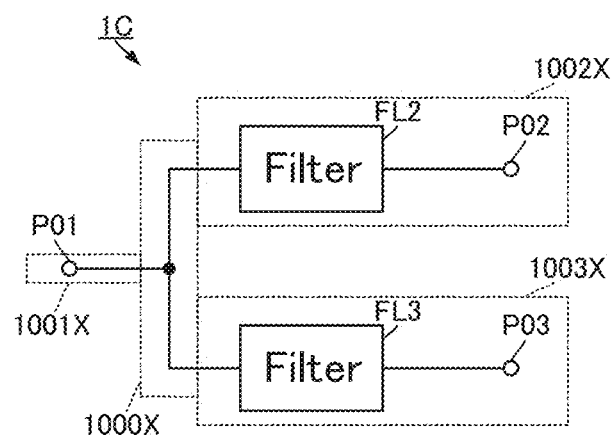
FIG. 11 is a block diagram of an electronic circuit that includes a resin multilayer substrate according to a preferred embodiment of the present invention.

Furthermore, the number of signal conductors may be one, and a circuit such as that illustrated in FIG. 11 may be provided. FIG. 11 is a block diagram of an electronic circuit that includes a resin multilayer substrate according to a preferred embodiment of the present invention.

As illustrated in FIG. 11, an electronic device 1C includes external connection terminals P01, P02, and P03. A filter FL2 is connected between the external connection terminal P01 and the external connection terminal P02. A filter FL3 is connected between the external connection terminal P01 and the external connection terminal P03. The filters FL2 and FL3 may preferably be defined by an LC filter circuit (a filter circuit including an inductor and a capacitor), a surface acoustic wave (SAW) filter, and other suitable filters, for example. The filter FL2 and the filter FL3 have different bandpass characteristics.

In such a circuit configuration, a region in which the external connection terminal P01 is disposed defines a first wiring portion 1001X. A region in which the external connection terminal P02 and the filter FL2 are disposed defines a second wiring portion 1002X. A region in which the external connection terminal P03 and the filter FL3 are disposed defines a third wiring portion 1003X. A region in which the first wiring portion 1001X, the second wiring portion 1002X, and the third wiring portion 1003X are connected to one another defines a connecting portion 1000X. In this manner, by using the configurations of the resin multilayer substrates according to the above-described preferred embodiments, branching circuits of a duplexer, a diplexer, and other suitable devices, for example, are able to be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A joint structure of a resin multilayer substrate and a circuit board comprising:
    the resin multilayer substrate and the circuit board; wherein
    the resin multilayer substrate includes:
        a substrate main body including a first wiring portion, a second wiring portion, and a third wiring portion that are connected to one another by a connecting portion, and a plurality of resin layers laminated together;
        a first signal conductor provided in the substrate main body so as to extend over the first wiring portion and the second wiring portion;
        a second signal conductor provided in the substrate main body so as to extend over the first wiring portion and the third wiring portion;
        a first external connection terminal provided in the first wiring portion and connected to at least one of the first signal conductor and the second signal conductor;
        a second external connection terminal provided in the second wiring portion and connected to the first signal conductor; and
        a third external connection terminal provided in the third wiring portion and connected to the second signal conductor;
    at least one of the first external connection terminal, the second external connection terminal, and the third external connection terminal is defined by a connector that is mounted on a conductor on a surface of the substrate main body, and at least another one of the first external connection terminal, the second external connection terminal, and the third external connection terminal is defined by a conductor on the surface of the substrate main body;
    an auxiliary mounting conductor is disposed between the at least one of the first external connection terminal, the second external connection terminal, and the third external connection terminal defined by the connector mounted on the surface and the at least one of the first external connection terminal, the second external connection terminal, and the third external connection terminal defined by the conductor on the surface;
    the circuit board is connected to the first external connection terminal, the second external connection terminal, and the third external connection terminal;
    an external connection terminal of the at least one of first external connection terminal, the second external connection terminal, and the third external connection terminal includes the connector that is mounted on the conductor on the surface of the substrate main body, and the external connection terminal is connected to the circuit board through the connector; and
    an external connection terminal of the first external connection terminal, the second external connection terminal, and the third external connection terminal without the connector and the auxiliary mounting conductor is directly connected to a mounting land conductor arranged on a surface of the circuit board.

2. The joint structure of the resin multilayer substrate and the circuit board according to claim 1, wherein the resin multilayer substrate includes a plurality of the auxiliary mounting conductors.

3. The joint structure of the resin multilayer substrate and the circuit board according to claim 2, wherein at least one of the plurality of auxiliary mounting conductors is provided for each of the first wiring portion and the connecting portion.

4. The joint structure of the resin multilayer substrate and the circuit board according to claim 3, wherein
    the circuit board includes a plurality of circuit boards; and
    the resin multilayer substrate is connected to the plurality of the circuit boards.

5. The joint structure of the resin multilayer substrate and the circuit board according to claim 2, wherein the plurality of auxiliary mounting conductors are ground conductors.

6. The joint structure of the resin multilayer substrate and the circuit board according to claim 5, wherein
    the circuit board includes a plurality of circuit boards; and
    the resin multilayer substrate is connected to the plurality of the circuit boards.

7. The joint structure of the resin multilayer substrate and the circuit board according to claim 2, wherein
    the circuit board includes a plurality of circuit boards; and
    the resin multilayer substrate is connected to the plurality of the circuit boards.

8. The joint structure of the resin multilayer substrate and the circuit board according to claim 1, wherein
    the resin multilayer substrate includes a plurality of the auxiliary mounting conductors; and
    the plurality of auxiliary mounting conductors join to the circuit board at a position between the at least one of the first external connection terminal, the second external connection terminal, and the third external connection terminal that is directly connected to the mounting land conductor and the at least one of the first external connection terminal, the second external connection terminal, and the third external connection terminal that includes the connector that is mounted on the conductor.

9. The joint structure of the resin multilayer substrate and the circuit board according to claim 8, wherein
    the circuit board includes a plurality of circuit boards; and
    the resin multilayer substrate is connected to the plurality of the circuit boards.

10. The joint structure of the resin multilayer substrate and the circuit board according to claim 1, wherein
    the resin multilayer substrate includes a ground conductor extending in a direction parallel or substantially parallel to the surface of the substrate main body; and
    the ground conductor is provided at least between the first signal conductor and the second signal conductor.

11. The joint structure of the resin multilayer substrate and the circuit board according to claim 10, wherein
    the circuit board includes a plurality of circuit boards; and
    the resin multilayer substrate is connected to the plurality of the circuit boards.

12. The joint structure of the resin multilayer substrate and the circuit board according to claim 1, wherein the resin multilayer substrate includes a buffering portion that has low elasticity and is located between the at least one of the first external connection terminal, the second external connection terminal, and the third external connection terminal that is directly connected to the mounting land conductor and the at least one of the first external connection terminal, the second external connection terminal, and the third external connection terminal that includes the connector that is mounted on the conductor.

13. The joint structure of the resin multilayer substrate and the circuit board according to claim 12, wherein
the circuit board includes a plurality of circuit boards; and
the resin multilayer substrate is connected to the plurality of the circuit boards.

14. The joint structure of the resin multilayer substrate and the circuit board according to claim 1, wherein the resin multilayer substrate includes a bent portion.

15. The joint structure of the resin multilayer substrate and the circuit board according to claim 14, wherein
the circuit board includes a plurality of circuit boards; and
the resin multilayer substrate is connected to the plurality of the circuit boards.

16. The joint structure of the resin multilayer substrate and the circuit board according to claim 1, wherein
the circuit board includes a plurality of circuit boards; and
the resin multilayer substrate is connected to the plurality of the circuit boards.

\* \* \* \* \*